United States Patent [19]

Fujishiro

[11] Patent Number: 4,868,973
[45] Date of Patent: Sep. 26, 1989

[54] APPARATUS FOR MOUNTING ELECTRIC PARTS

[75] Inventor: Keisuke Fujishiro, Shimizu, Japan
[73] Assignee: Hitachi, Ltd., Tokyo, Japan
[21] Appl. No.: 230,079
[22] Filed: Aug. 9, 1988

[30] Foreign Application Priority Data

Aug. 12, 1987 [JP] Japan .................................. 62-201633

[51] Int. Cl.[4] ............................................. B23P 19/04
[52] U.S. Cl. ........................................ 29/740; 29/593;
29/759; 221/211; 221/277; 209/573; 414/225;
414/744.1
[58] Field of Search .................. 29/759, 740, 741, 593;
209/571, 573; 414/225, 744.1, 744.3, 744.4;
221/211, 277

[56] References Cited

U.S. PATENT DOCUMENTS

| | | | |
|---|---|---|---|
| 3,541,675 | 11/1970 | Pennings | 29/740 |
| 4,653,664 | 3/1987 | Hineno et al. | 29/759 |
| 4,672,742 | 6/1987 | Juan | 29/740 |
| 4,704,792 | 11/1987 | Itagaki et al. | 29/739 |
| 4,763,405 | 8/1988 | Morita et al. | 29/759 |

Primary Examiner—P. W. Echols
Attorney, Agent, or Firm—Antonelli, Terry & Wands

[57] ABSTRACT

In an apparatus for mounting electronic parts onto a printed board, each of suction heads mounted on a peripheral portion of an intermittently rotatable index table attracts by suction a corresponding one of the electronic parts at a part attracting position. With rotation of the index table, the suction head holding the attracted electronic part is transferred to a part mounting position, where the electronic part is mounted onto the printed board. At least two positioners are arranged along the path of the transferred suction head for adjusting the part attracted on the suction head to its correct position and direction. The positioners are arranged respectively on both sides divided by a line extending from the attracting position to the mounting position. The positioners adjust respective kinds of electronic parts which are different from each other in configuration and size. A rotational direction of the index table is selected according to the kind of the attracted electronic part so that the part can be adjusted by the positioner on the side of the selected direction.

1 Claim, 3 Drawing Sheets

APPARATUS FOR MOUNTING ELECTRIC PARTS

BACKGROUND FOR MOUNTING ELECTRONIC PARTS

The present invention relates to an apparatus for mounting electronic parts of surface-mounted type onto a printed board and, more particularly, relates to a type of apparatus for mounting electronic parts, which can mount various kinds of electronic parts different in size from each other and which can operate at high speed.

A conventional type electronic-part mounting apparatus has a plurality of suction heads which are arranged along a peripheral portion of an index table rotating intermittently in a fixed direction. Each suction head is provided with a vacuum suction nozzle. Each electronic part supplied to a suction station by a part-feeder is attracted by suction on a corresponding one of the suction nozzles at the suction station. The electronic part attracted on the forward end of the suction nozzle is moved with intermittent rotation of the index table, and is adjusted to its correct position and direction by an adjusting and positioning means (hereinafter also referred also to as "positioner") arranged on a path along which the suction nozzles move. Then, the electronic part is brought to a mounting station where the part is released from the suction nozzle and is mounted onto a printed board. Subsequently, the suction head again returns to the suction station with the index table rotating in the fixed direction, and repeats the above operation. A conventional electronic-part mounting apparatus has as disclosed in Japanese Unexamined Patent Publication No. 61-179595, only one adjusting-positioning means (positioner) for adjusting the electronic part to its correct position and direction, so that the apparatus cannot mount various kinds of electronic parts largely different in configuration and size from each other.

In order to overcome the above-mentioned drawback, a new type electronic-part mounting apparatus including at least two positioners has been developed in recent years. FIG. 3 of the accompanying drawings is a diagrammatic top plan view of the electronic-part mounting apparatus which includes two positioners. An index table 2 is provided at its peripheral portion with a plurality of suction heads 6 and is rotated intermittently in a fixed direction indicated by an arrow. An electronic part in the form of a chip component is attracted by suction onto the suction head 6 from a part feeder table 1 which shifts along its longitudinal axis from side to side. With the intermittent rotation of the index table 2 in the direction indicated by the arrow, the electronic part attracted on the suction head 6 is moved onto either one of two positioners 3a and 3b for adjusting the electronic part to its correct position and direction. Either of the two positioners 3a and 3b is selected according to the configuration and size of the part and one of them is used. The part adjusted to its correct position and direction is transported with rotation of the index table 2, and the state of the attracted part is checked by a detector 4. Subsequently, the part is mounted onto the printed board 5 which is positioned with a positioning table movable in X and Y directions.

FIGS. 4A and 4B are respectively side elevational and plan views illustrating the positioner 3a or 3b. Four adjusting claws 13a through 13d are guided in respective guides 14a through 14d which are fixed on a disk 11 and whose longitudinal axes make a right-angled cross form. The disc 11 is rotated and stands still at a desired angle according to the direction of the part. One of the vacuum nozzles 12 of the suction heads 6 mounted on the index table 2 is lowered so that the electronic part 9 attracted on the forward ends of the vacuum nozzle 12 is set among the forward ends of the adjusting claws 13a through 13d. These four adjusting claws move forward along the respective axes and push the part 9 to adjust the part 9 to its correct position and direction. Subsequently, the nozzle 12 holding the part 9 by suction is again raised. Each of the two positioners 3a and 3b has its structure as shown in FIGS. 4A and 4B, but they are different from each other in the size of the adjusting claws and in the size of the space surrounded by the adjusting claws when they are closed, so that various kinds of electronic parts largely different in configuration and size from each other can be adjusted. When one of the two positioners 3a and 3b is selected according to the configuration and size of the part retained by the nozzle 12, the nozzle 12 stands still above that selected positioner and is lowered thereto. But, above the positioner not to be selected, the nozzle 12 passes away without lowering.

Since, in the above-described prior art, the positioners and the detector are arranged at a half side of the index table 2, the diameter of the index table increases. As a result, the accuracy on mounting the electronic parts to the nozzle deteriorates, and the situation of the part attracted on the forward end of the suction head is apt to be changed by the centrifugal force increased in proportion to the diameter of the index table. In order to prevent these, it is required to reduce the mean rotational speed of the index table, and it results in reduction of the productivity. In order to prevent such reduction in the productivity, it is required to increase a number of the suction heads mounted on the index table, so that a capacity of a driving source for intermittent rotation of the index table increases. Thus, the apparatus according to the prior art has various disadvantages regarding an increase in operational speed, a reduction in size and a reduction in cost.

SUMMARY OF THE INVENTION

It is an object of the invention to provide an electronic-part mounting apparatus, comprising at least two positioners for adjusting respective kinds of electronic parts largely different in configuration and size from each other, without an increase in diameter of an index table or an increase in size of the apparatus, and being suitable for increase in operational speed of the apparatus.

According to the invention, there is provided an apparatus for mounting electronic parts to a printed board comprising:

an index table rotating intermittently in either of a first direction and a second direction opposite to the first direction;

a plurality of suction heads for attracting and transferring the electronic parts, which are mounted on a peripheral portion of the index table, each of which attracts and holds an electronic part at a part attracting position, and transfers the attracted electronic part to a part mounting position with rotation of the index table and then mounts the electronic part onto the printed board; and at least two adjusting means (in a word, positioners), each of which adjusts the attracted electronic part on the suction head to its correct position and direction in the course of transferring the attracted part from the part attracting position to the part mounting position, the plurality of the adjusting means adjusting respective kinds of electronic parts which are largely different from each other in configuration and size, characterized in that, both sides in the apparatus divided by a line extending from the part attracting position to the part mounting position, have the respective adjusting means, and a rotational direction of the index table is selected according to the kind of the attracted electronic part so that the part can be adjusted by the adjusting means on the side of the selected direction.

DETAILED DESCRIPTION

An electronic-part mounting apparatus according to an embodiment of the invention will be described with reference to FIG. 1 which is a perspective view of the entire apparatus and with reference to FIG. 2 which is a diagrammatic top plan view of the apparatus.

Figure 1:
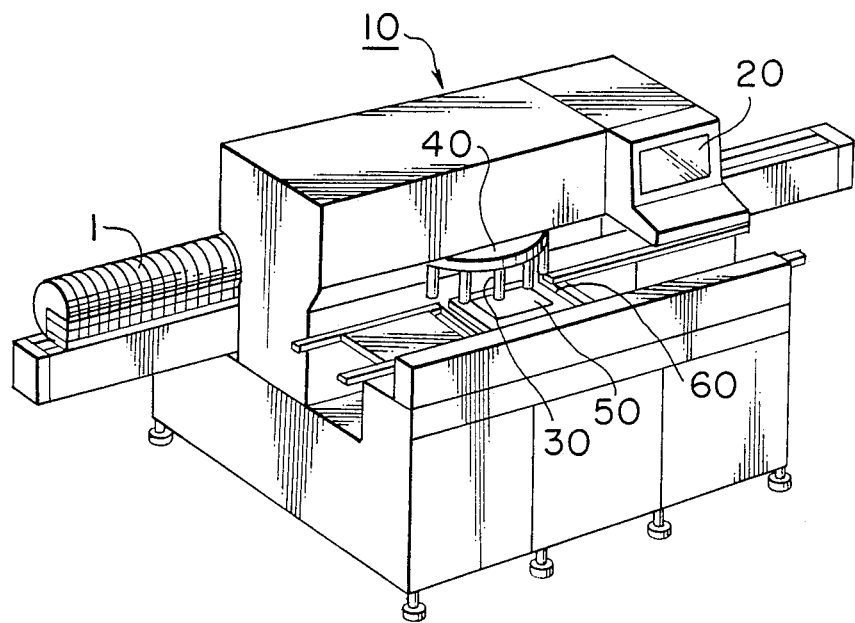
FIG. 1 is a schematic perspective view of an electronic-part mounting apparatus according to an embodiment of the invention.

Referring to FIG. 1, there is shown the electronic-part mounting apparatus 10 in a diagrammatic perspective view. A part feeder table 1 of tape-feeder-type in the illustrated embodiment moves horizontally and stops at a desired position in accordance with a control signal from a controller 20, to bring a desired electronic part to an attracting station or a part attracting position. A plurality of vertically movable mounting heads or suction heads 6 are arranged on a peripheral portion of an index rotary disc or an index table 7 at regular distances. The index table 7 is rotatable intermittently in a first or normal direction and in a second or reverse direction. The suction heads 36 are brought successively to the part suction position. As each of the suction heads 6 is brought to the part suction position, the suction head 6 is lowered to attract by suction the electronic part from the part feeder table 1. After the attraction, the suction head 6 moves upwardly. Subsequently, the suction head 6 is transferred toward a mounting station or a part mounting position. As the suction head 6 reaches the part mounting position, the suction head 6 moves downwardly to mount the electronic part onto a desired position on a printed board 5 which is set on a positioning table 60 movable in X and Y directions perpendicular to each other. The suction head 6 then again moves upwardly. Subsequently, the suction head 6 is again brought to the part attracting position with the rotation of the index table 7, and repeats the above-mentioned operation. The plurality of suction heads 6 carry out the above-mentioned operation successively.

Figure 2:
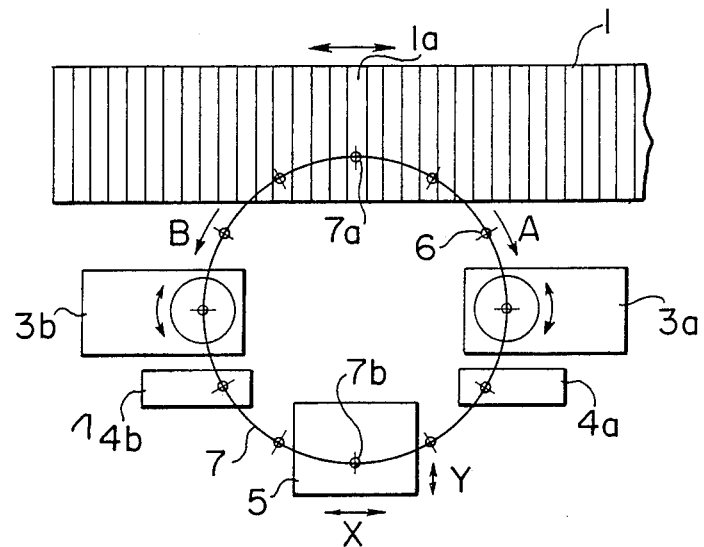
FIG. 2 is a diagrammatic plan view of the apparatus illustrated in FIG. 1.
Figure 3:
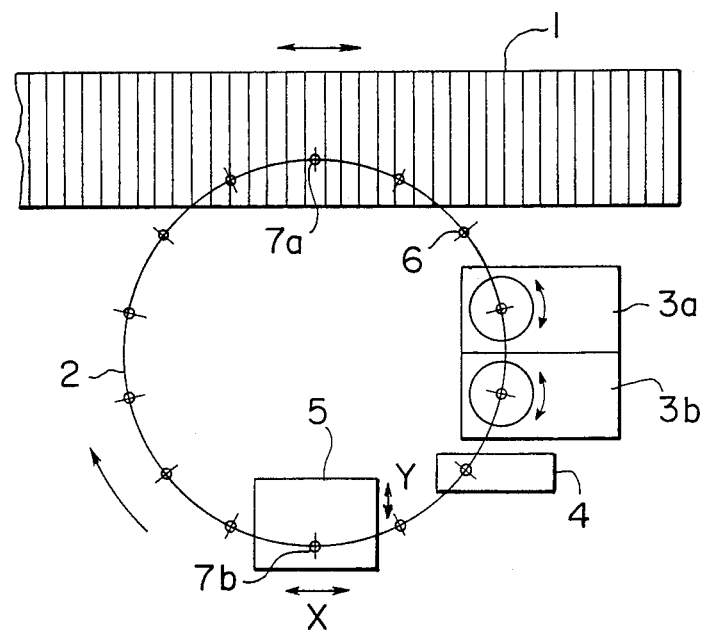
FIG. 3 is a diagrammatic plan view of a conventional electronic-part mounting apparatus.

As shown in FIG. 2, the index table 7 is rotatable intermittently in the normal direction indicated by an arrow A and in the reverse direction indicated by an arrow B. The plurality of suction heads 6 having respective suction nozzles are mounted on the peripheral portion of the index table 7. The chip components are supplied by the part feeder table 1 which is selectively movable to the right and left. The chip component within a part feeder container 1a of the part feeder table 1, when the container of the desired component is brought to the part attracting position 7a, is attracted by suction onto the suction head 6 brought to the part attracting position 7a with the index table 7. Thus, the electronic part is held by the suction head 6. The electronic part is then transported toward the part mounting position 7b with the index table 7 rotating in the normal or reverse direction A or B. In the course of the transportation, the electronic part is positioned and adjusted to its correct position and direction by the positioner 3a or 3b, and is also measured and checked by either one of detectors 4a and 4b. Subsequently, the electronic part reaches the part mounting position 7b where the electronic part is mounted onto the printed board 5.

The arrangement of the positioners 3a and 3b and the detectors 4a and 4b will be described below in detail.

Figure 4A:
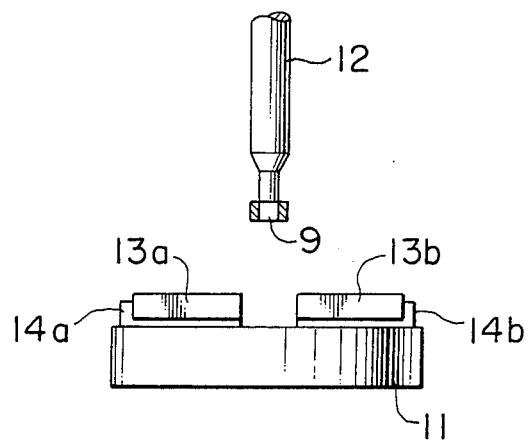
FIG. 4A is a side elevational view of part adjusting and positioning means.
Figure 4B:
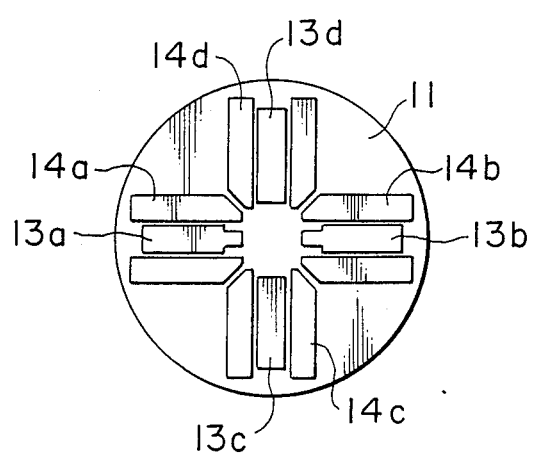
FIG. 4B is a plan view of the part adjusting and positioning means illustrated in FIG. 4A.

The positioners 3a and 3b true up the positions of the centers of gravity of the chip components which are attracted by suction and held on the suction heads 6, and adjust the chip components to their respective correct positions and directions. The positioners 3a and 3b may be as shown in FIG. 4. The detectors 4a and 4b measure and check the state of the chip component attracted on the suction head by suction. As shown in FIG. 2, the positioners 3a and 3b are arranged on their respective sides divided by a line extending from the part attracting position 7a to the part mounting position 7b, and the detectors 4a and 4b are also arranged on their respective sides divided by the line. According to the kind of the electronic part attracted on the suction head, one of the normal and the reverse directions A and B is selected so that the electronic part can be transferred to the appropriate positioner. That is, the positioners 3a and 3b have their respective working capabilities different from each other so that various kinds of the electronic parts largely different in configuration and size from each other can be adjusted. The index table 7 is rotated in either one of the directions indicated respectively by the arrows A and B according to the configuration and size of the electronic parts so that one of the positioners 3a and 3b, appropriate for the attracted electronic part, can adjust the electronic part to its correct position and direction, and one of the detectors 4a and 4b, appropriate for the electronic part, can measure and check the state of the electronic part. In this manner, with the intermittent rotation of the index table 7 in the normal or reverse direction, each electronic part is adjusted to its correct position and direction by the positioner 3a or 3b, and is further measured and checked by the detector 4a or 4b. Subsequently, the electronic part brought to the part mounting position 7b is released from the suction head 6, and is mounted onto a desired position on the printed board 5 set on the X and Y positioning table 60 (see FIG. 1).

Frequent reversings of the rotational direction of the index table 7 in the electronic-part mounting apparatus as shown above requires much useless time, so that a period for mounting the desired electronic parts per one printed board 50 becomes long. Accordingly, it is efficient to set the sequence for mounting the parts such that the selected rotational direction of the index table 7 can be maintained as long as possible.

According to the illustrated embodiment, since the rotational direction of the index table 7 can be reversed, the positioner 3b and the detector 4b can be arranged at their respective locations which have not conventionally been utilized, so that it becomes possible to adjust and check new kinds of electronic components which the positioner 3a and the detector 4a have conventionally been unable to adjust and check. Moreover, since it is unnecessary to increase the size of the index table in the apparatus according to the embodiment, unlike the case of the conventional electronic-part mounting apparatus, no bad influence is exerted upon the accuracy in mounting of the electronic components. Further, since it is not required to bring the index table to a large size, there is no increase in centrifugal force or the like due to the rotation of the index table, so that it is unnecessary to lower the mean rotational speed of the index table. Accordingly, it is not required to increase a number of the suction heads in order to prevent the productivity from being lowered, and it is also not required to increase the capacity of the driving source for the index table. Thus, the apparatus according to the illustrated embodiment is advantageous in an increase of the operational speed, a reduction in size, and a reduction in cost.

As described above, according to the invention, there is provided an electronic-part mounting apparatus which can mount various electronic components largely different in configuration and size from each other, and which can improve an accuracy in mounting of the electronic parts, so that the apparatus can increase the operational speed, reduce the size of the apparatus, and reduce the cost.

What is claimed is:

1. An apparatus for mounting electronic parts to a printed board, comprising:
   an index table rotating intermittently in either of a first direction and a second direction opposite to the first direction;
   a plurality of suction heads for attracting and transferring the electronic parts, which are mounted on a peripheral portion of the index table, each of which attracts and holds an electronic part at a part attracting position, and transfers the attracted electronic part to a part mounting position with rotation of the index table and then mounts the electronic part onto the printed board; and
   at least two adjusting means the adjusting means adjusting the attracted electronic part on the suction head to its correct position and direction in the course of transferring the attracted part from the part attracting position to the part mounting position, the plurality of the adjusting means adjusting respective kinds of electronic parts which are largely different from each other in configuration and size, and wherein,
   both sides in the apparatus divided by a line extending from the part attracting position to the part mounting position, have the respective adjusting means, and
   a rotational direction of the index table is selected according to the kind of the attracted electronic part so that the part can be adjusted by the adjusting means on the side of the selected direction.

* * * * *